United States Patent
Peddu et al.

(10) Patent No.: US 9,911,478 B1
(45) Date of Patent: Mar. 6, 2018

(54) METHOD AND APPARATUS FOR AUTO-CALIBRATION OF DELAY SETTINGS OF MEMORY INTERFACES

(71) Applicant: Ikanos Communications, Inc., San Diego, CA (US)

(72) Inventors: Subash Babu Peddu, Fremont, CA (US); Venkatramana Kamasani, Bangalore (IN); Vijay Shikhamani Kalakotla, Bangalore (IN); Daniel Cunza, Woodbridge, NJ (US)

(73) Assignee: Ikanos Communications, Inc., San Diego, CA (US)

( * ) Notice: Subject to any disclaimer, the term of this patent is extended or adjusted under 35 U.S.C. 154(b) by 0 days.

(21) Appl. No.: 15/413,936

(22) Filed: Jan. 24, 2017

(51) Int. Cl.
G11C 7/10 (2006.01)
G11C 7/22 (2006.01)
G11C 29/12 (2006.01)
G11C 11/4096 (2006.01)

(52) U.S. Cl.
CPC ............ G11C 7/22 (2013.01); G11C 11/4096 (2013.01); G11C 29/12015 (2013.01)

(58) Field of Classification Search
None
See application file for complete search history.

(56) References Cited

U.S. PATENT DOCUMENTS

| | | | | |
|---|---|---|---|---|
| 6,167,528 A * | 12/2000 | Arcoleo | ............... | G06F 1/10 |
| | | | | 713/501 |
| 7,036,053 B2 * | 4/2006 | Zumkehr | ............ | G11C 7/1051 |
| | | | | 714/709 |
| 7,443,741 B2 * | 10/2008 | Butt | ............ | G11C 7/1006 |
| | | | | 365/174 |
| 7,808,849 B2 * | 10/2010 | Swain | ............ | G11C 5/04 |
| | | | | 365/189.07 |
| 7,924,637 B2 * | 4/2011 | Searles | ............... | G11C 7/1051 |
| | | | | 365/189.07 |
| 8,341,450 B2 * | 12/2012 | Chang | ............... | G06F 13/1689 |
| | | | | 702/89 |
| 8,407,441 B2 * | 3/2013 | Giovannini | ......... | G11C 7/1078 |
| | | | | 711/100 |
| 8,661,285 B2 | 2/2014 | Lee et al. | | |
| 9,043,518 B2 | 5/2015 | Grunzke | | |
| 9,142,281 B1 * | 9/2015 | Giovannini | ......... | G11C 7/1078 |
| 9,437,326 B2 | 9/2016 | Razzaz et al. | | |
| 2005/0135167 A1 * | 6/2005 | Manabe | ............... | G11C 7/1072 |
| | | | | 365/201 |
| 2008/0276133 A1 | 11/2008 | Hadley et al. | | |

* cited by examiner

*Primary Examiner* — Son Mai
(74) *Attorney, Agent, or Firm* — Loza & Loza, LLP/Qualcomm

(57) ABSTRACT

In some aspects, a calibration method includes performing a write/read test for each one of multiple combinations of write/read delay settings, wherein each one of the multiple combinations of write/read delay settings includes one of a plurality of write delay settings of a first delay device and one of a plurality of read delay settings of a second delay device. The method also includes obtaining test results for the write/read tests, determining a pass region based on the test results, determining a center of the pass region, and selecting one of the multiple combinations of write/read settings based on the center of the pass region.

21 Claims, 7 Drawing Sheets

METHOD AND APPARATUS FOR AUTO-CALIBRATION OF DELAY SETTINGS OF MEMORY INTERFACES

BACKGROUND

Field

Aspects of the present disclosure relate generally to memory interfaces, and more particularly, to auto-calibration of delay settings of memory interfaces.

Background

A system on a chip (SoC) may include a memory interface for interfacing one or more circuit blocks (e.g., processors) on the SoC with an external memory device (e.g., dynamic random access memory (DRAM)). The memory interface may include a memory controller and a physical (PHY) block. The memory controller is responsible for servicing read/write requests from circuit blocks on the SoC needing access to the external memory device. The memory controller communicates with the external memory device via the PHY block, which includes multiple transmitters (drivers) for transmitting signals to the external memory device, and multiple receivers for receiving signals from the external memory device.

SUMMARY

The following presents a simplified summary of one or more embodiments in order to provide a basic understanding of such embodiments. This summary is not an extensive overview of all contemplated embodiments, and is intended to neither identify key or critical elements of all embodiments nor delineate the scope of any or all embodiments. Its sole purpose is to present some concepts of one or more embodiments in a simplified form as a prelude to the more detailed description that is presented later.

A first aspect relates to a calibration method. The method includes performing a write/read test for each one of multiple combinations of write/read delay settings, wherein each one of the multiple combinations of write/read delay settings includes one of a plurality of write delay settings of a first delay device and one of a plurality of read delay settings of a second delay device. The method also includes obtaining test results for the write/read tests, determining a pass region based on the test results, determining a center of the pass region, and selecting one of the multiple combinations of write/read settings based on the center of the pass region.

A second aspect relates to a memory interface. The method interface includes a first delay device in a transmit path of the memory interface, a second delay device in a receive path of the memory interface, and an auto-calibration engine configured to set delays of the first and second delay devices to each one of multiple combinations of write/read delay settings, each one of the multiple combinations of write/read delay settings including one of a plurality of write delay settings of the first delay device and one of a plurality of read delay settings of the second delay device. The memory interface also includes a memory controller configured to perform a write/read test for each one of the multiple combinations of write/read delay settings. The auto-calibration engine is further configured to obtain test results for the write/read tests, determine a pass region based on the write/read test results, determine a center of the pass region, and select one of the multiple combinations of write/read settings based on the center of the pass region.

A third aspect relates to a computer-readable medium including instructions stored thereon that, when executed by a processor, cause the processor to perform a calibration method. The calibration method includes performing a write/read test for each one of multiple combinations of write/read delay settings, wherein each one of the multiple combinations of write/read delay settings includes one of a plurality of write delay settings of a first delay device and one of a plurality of read delay settings of a second delay device. The calibration method also includes obtaining test results for the write/read tests, determining a pass region based on the test results, determining a center of the pass region, and selecting one of the multiple combinations of write/read settings based on the center of the pass region.

To the accomplishment of the foregoing and related ends, the one or more embodiments include the features hereinafter fully described and particularly pointed out in the claims. The following description and the annexed drawings set forth in detail certain illustrative aspects of the one or more embodiments. These aspects are indicative, however, of but a few of the various ways in which the principles of various embodiments may be employed and the described embodiments are intended to include all such aspects and their equivalents.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Figure 1:
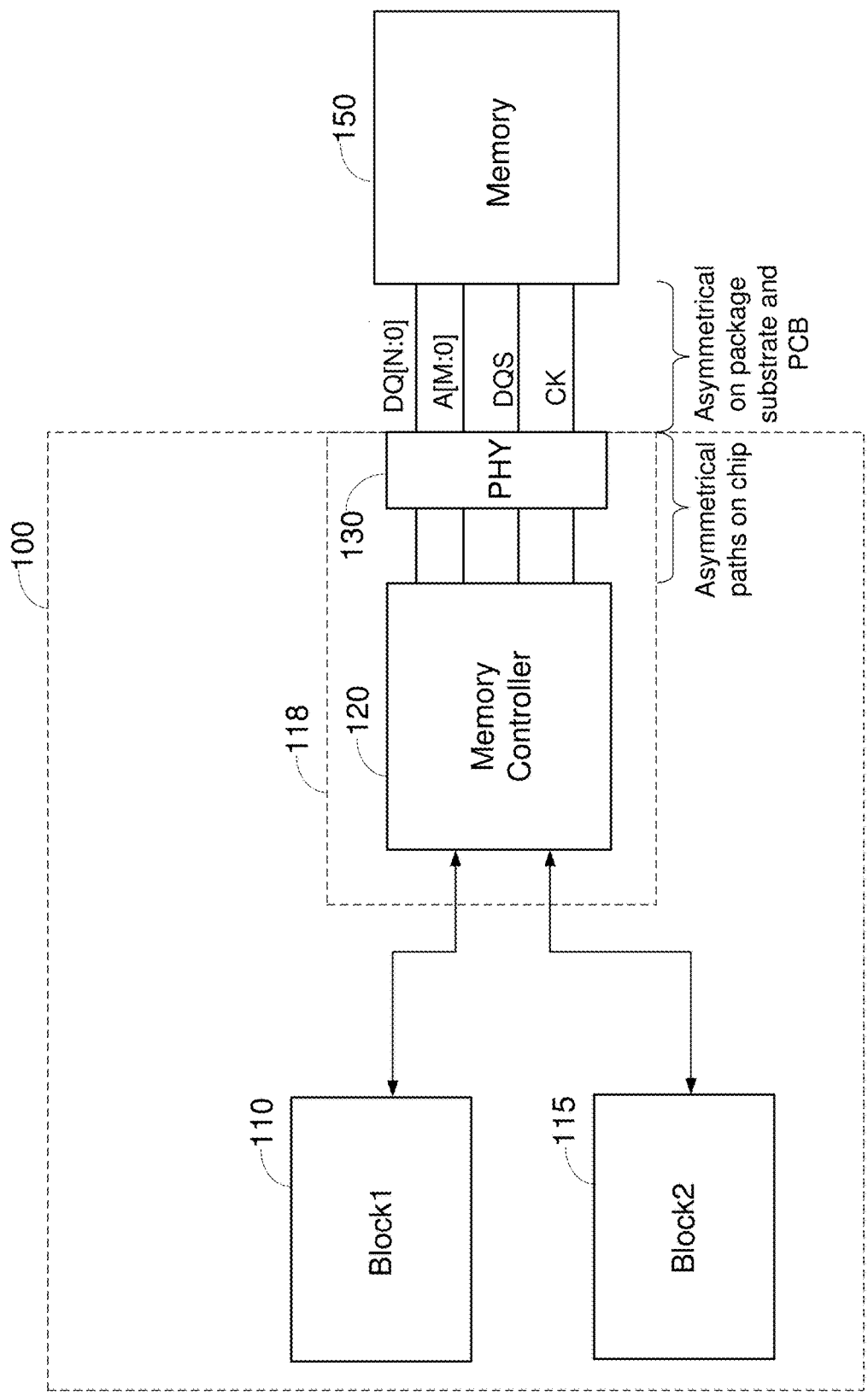
FIG. 1 shows an example of a system on a chip (SoC) including a memory interface according to certain aspects of the present disclosure.

A system on a chip (SoC) may include a memory interface for interfacing one or more circuit blocks on the SoC with an external memory device. In this regard, FIG. 1 shows an example of a system on a chip (SoC) 100 including a memory interface 118 for interfacing circuit blocks 110 and 115 on the SoC 100 with an external memory device 150 (e.g., a double data rate (DDR) memory device). The circuit blocks may include a central processing unit (CPU), a graphics processing unit (GPU), etc. Although two circuit blocks 110 and 115 are shown in FIG. 1 for ease of illustration, it is to be appreciated that the memory interface 118 may interface more than two circuit blocks on the SoC with the external memory device 150.

The memory interface 118 includes a memory controller 120 and a physical (PHY) block 130. The memory controller 120 manages the transfer of data between the external memory device 150 and a circuit block (e.g., block 110 or 115) on the SoC 100 that needs to access the external memory device 150 (e.g., write data to and/or read data from the memory device 150).

The memory controller 120 communicates with the memory device 150 via the PHY block 130. The PHY blocks 130 is coupled to the external memory device 150 via multiple lines (e.g., traces) on a printed circuit board (PCB) and/or another substrate. The PHY block 130 includes multiple transmitters (drivers) for transmitting signals to the memory device 150, and multiple receivers for receiving signals from the memory device 150. The PHY block 130 also includes delay devices for aligning incoming and/or outgoing signals with a data strobe signal or a clock signal (e.g., DDR clock signal), as discussed further below.

To write data to the memory device 150, a circuit block (e.g., block 110 or 115) sends a write request to the memory controller 120. The write request includes the data and a logical address for the data. To service the write request, the memory controller 120 maps the logical address to a physical address in the memory device 150, and sends corresponding command/address/data signals to the memory device 150 via the PHY block 130 to write the data to the physical address in the memory device 150.

To read data from the memory device 150, a circuit block (e.g., block 110 or 115) sends a read request to the memory controller 120. The read request includes a logical address for the data to be read from the memory 150. To service the read request, the memory controller 120 maps the logical address to a physical address in the memory device 150, and sends corresponding command/address signals to the memory device 150 via the PHY block 130 to read the data from the physical address in the memory device 150. Upon receiving the data from the memory device 150, the memory controller 120 sends the data to the block.

The circuit blocks 110 and 115 may share the external memory device 150 on a time-shared basis. For example, the memory controller 120 may receive read/write requests from the circuit blocks 110 and 115, place the read/write requests in a buffer (not shown), and process the read/write requests in the buffer one at a time. In this regard, the memory controller 120 may schedule and perform read/write operations to service the read/write requests in the buffer.

The memory controller 120 also may perform housekeeping operations such as refreshing the memory device 150, performing ZQ calibrations, etc.

In certain aspects, the PHY block 130 transmits data to and receives data from the memory device 150 over multiple data lines DQ[N:0]. This allows the PHY block 130 to transmit and receive multiple data bits in parallel. The PHY block 130 may also transmit a memory address to the memory device 150 over multiple address lines A[M:0]. The PHY block 130 may also transmit a data strobe signal to the memory device 150 or receive a data strobe signal from the memory device 150 via a data strobe (DQS) line between the PHY block 130 and the memory device 150. The data strobe signal may be used to time the sampling of read data at the PHY block 130 and time the sampling of write data at the memory device 150 according to a Joint Electron Device Engineering Council (JEDEC) standard or another standard. The PHY block 130 may also transmit a clock signal (e.g., DDR clock signal) to the memory device or receive a clock signal from the memory device via a clock (CK) line between the PHY block 130 and the memory device 150. The clock signal may be used for timing address and/or command signals.

In practice, the signal paths are asymmetrical due to package substrate parasitics and printed circuit board (PCB) layout parasitics. This causes misalignment (skew) between the data signals and the data strobe signal. To address this problem, the PHY block 130 includes programmable delay devices in the data paths that delay the signals in the data paths to compensate for the skew and align the data signals with the data strobe (DQS) signal.

Figure 2:
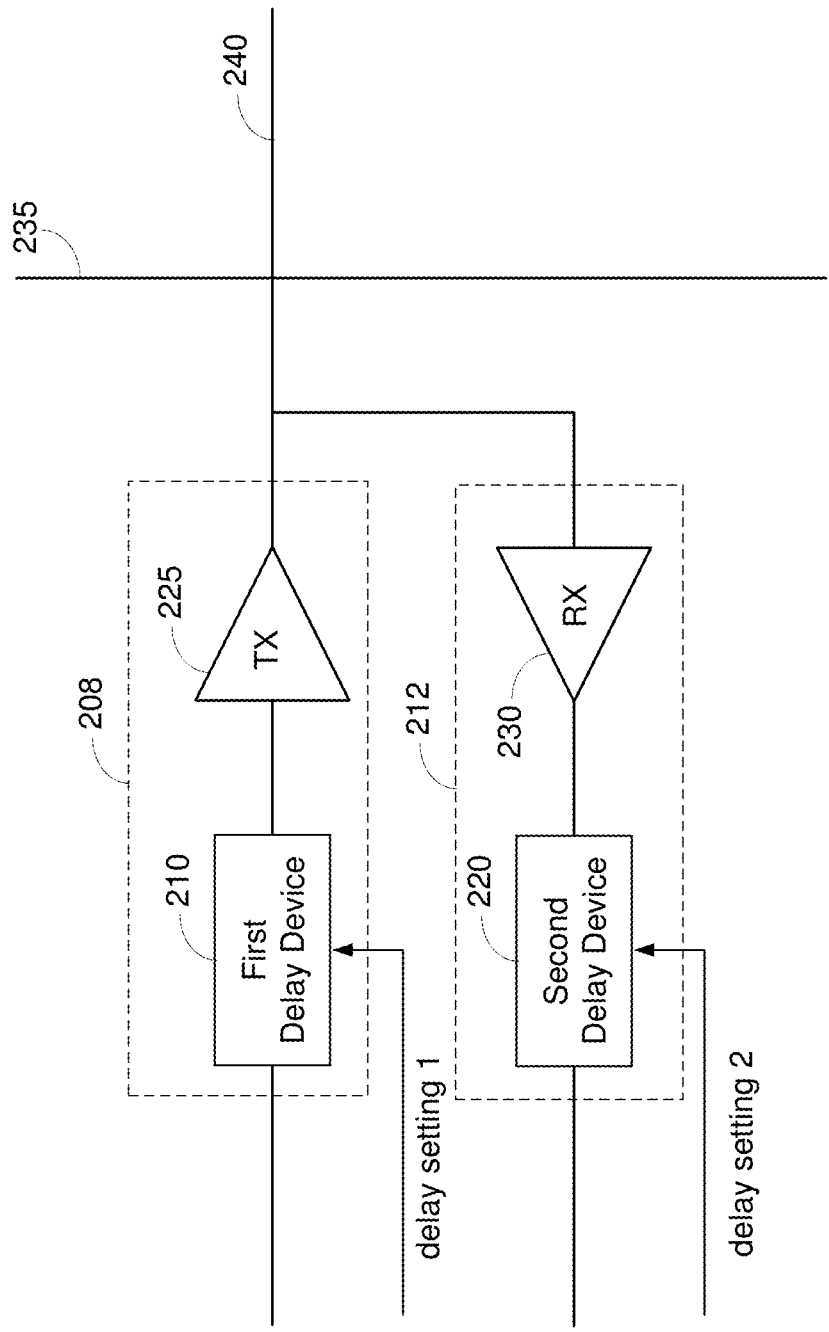
FIG. 2 shows an example of programmable delay devices according to certain aspects of the present disclosure.

FIG. 2 below shows an example in which the PHY block 130 includes a first programmable delay device 210 in a transmit data path 208, and a second programmable delay device 220 in a receive data path 212. The PHY block 130 also includes a transmitter 225 (driver) in the transmit data path 208, and a receiver 230 in the receive data path 212. In this example, the transmit and receive data paths 208 and 212 are coupled to the external memory device 150 (not shown in FIG. 2) via a bidirectional line 240, which may include one or more traces on the PCB. In FIG. 2, the boundary of the SoC 100 is indicated by line 235.

The delay setting of the first programmable delay device 210 (denoted "delay setting 1" in FIG. 2) may be set to de-skew data signals for write operations, and the delay setting of the second programmable delay device 220 (denoted "delay setting 2" in FIG. 2) may be set to de-skew data signals for read operations. Although one pair of delay devices 210 and 220 is shown in FIG. 2 for ease of illustration, it is to be appreciated that the PHY 160 block may include multiple pairs of delay devices (e.g., a pair of delay devices for each bidirectional line).

In conventional systems, the delay settings of the delay devices are static. The delay settings are determined based on skew measurements of sample SoCs, and then applied to all SoCs in production. SoC to SoC variation is not taken into account in this approach.

The determined delay settings are encoded in the firmware of each SoC (e.g., memory interface of each SoC). Once the delay settings are encoded on an SoC, the delay settings cannot be changed until the firmware is updated with a new release of the firmware.

Embodiments of the present disclosure provide methods and apparatuses for on-chip auto-calibration of delay settings of memory interfaces (e.g., DDR memory interfaces), as discussed further below.

Figure 3:
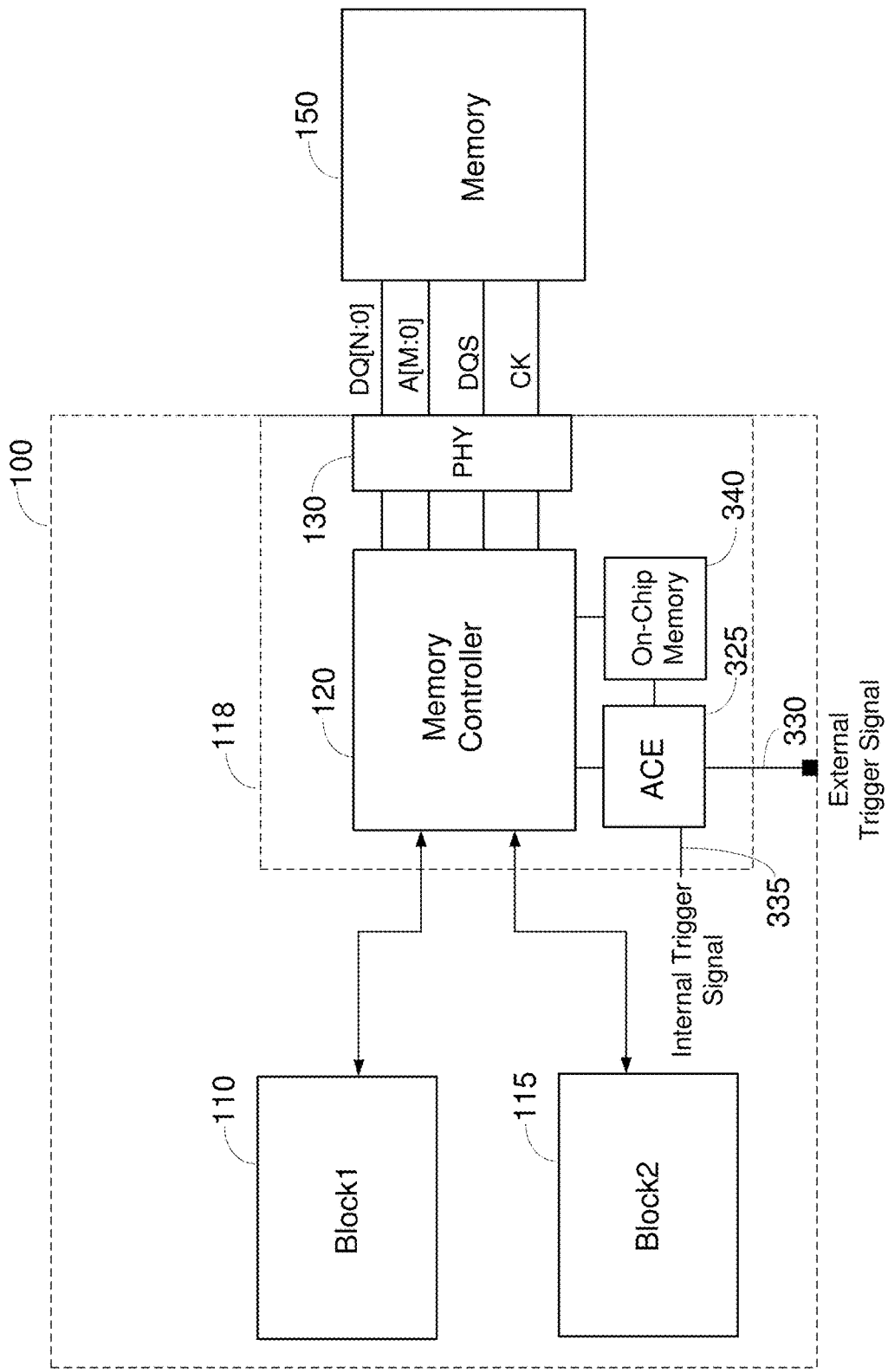
FIG. 3 shows an example of a memory interface including an auto-calibration engine according to certain aspects of the present disclosure.

In some embodiments, the memory interface 118 includes an auto-calibration engine (ACE) 325 coupled to the memory controller 120, an example of which is shown in FIG. 3. The ACE 325 is configured to perform auto-calibration operations to determine delay settings for delay devices in the PHY block 130. The auto-calibration operations may be triggered at boot up, triggered by a trigger signal input to the ACE 325, etc. The auto-calibration operations include sweeping the delay devices through different delay settings, and performing write/read tests for the different delay settings, as discussed further below.

In one example, the ACE 325 auto-calibrates the delay settings for a write delay device (e.g., first delay device 210) and a read delay device (e.g., second delay device 220). In this example, the ACE 325 sweeps the write delay device (e.g., first delay device 210) through different write delay settings, and sweeps the read delay device (e.g., second delay device 220) through different read delay settings. For each combination of write/read delay settings, the ACE 325 performs a read/write test using a test pattern. The read/write test includes writing the test pattern to the memory device 150, reading back the test pattern from the memory device 150, and determining whether the test pattern is received in error from the memory device 150. The read/write test results for the different combinations of write/read delay settings may be stored in a matrix on an on-chip memory 340. An example of the matrix is shown in FIG. 4 according to certain aspects of the present disclosure.

The delay of each delay device may be adjusted in increments of a delay unit, in which one delay unit may correspond to a predetermined time delay. In the example shown in FIG. 4, the write delay device is swept from a write delay setting of zero to a write delay setting of 15 delay units, and the read delay device is swept from a read delay setting of zero to a read delay setting of 15 delay units.

For each combination of write/read delay settings, the matrix 410 includes the corresponding read/write test result. The number for each test result in the matrix indicates the number of errors. A test result of zero indicates no error (i.e., the test pattern was read back from the memory device 150 with no errors). In this example, a test result of one or more (which indicates one or more errors) is considered a fail, and a test result of zero is considered a pass.

Figure 4:
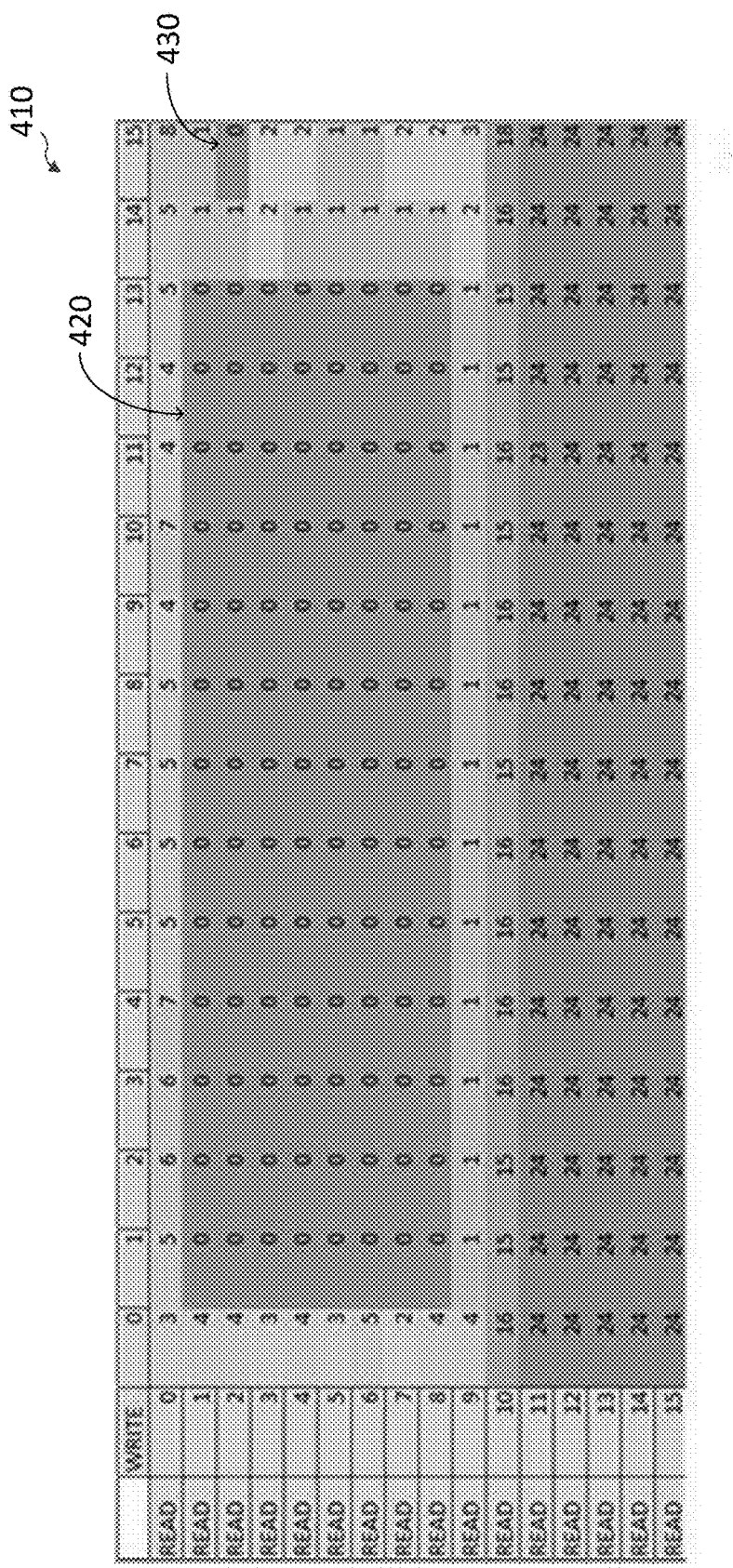
FIG. 4 shows an example of a matrix including test results for different combinations of write/read delay settings according to certain aspects of the present disclosure.

The exemplary matrix 410 shown in FIG. 4 includes a pass region 420 in which there are no errors. In this example, the pass region 420 spans from write delay setting 1 to write delay setting 13 in the horizontal direction, and spans from read delay setting 1 to read delay setting 8 in the vertical direction. The pass region 420 may also be referred to as a pass window or another terminology. As shown in FIG. 4, the pass region 420 is two-dimensional with one dimension corresponding to the write delay settings and another dimension corresponding to the read delay settings.

The ACE 325 may determine the write/read delay settings for the delay devices by calculating a center of gravity of the pass region 420. The ACE 325 may calculate the center of gravity of the pass region 420 by calculating the mean of the write delay settings in the pass region 420, and the mean of the read delay settings in the pass region 420. In the example in FIG. 4, the mean of the write delay settings in the pass region 420 is 7 delay units, and the mean of the read delay settings in the pass region 420 is 4.5 delay units.

Since the mean read delay setting in the above example is 4.5 (which is not one of the available read delay settings), the read delay setting may be set to one of the closest available read delay settings (i.e., 4 or 5 delay units). Thus, in this example, the auto-calibration procedure determines a write delay setting of 7 delay units for the write delay device, and a read delay setting of 4 or 5 delay units for the read delay device. In general, in cases where none of the combinations of read/write delay settings is located at the exact center of the pass region 420, the auto-calibration procedure may select the combination of read/write delay settings located closest to the center of the pass region 420.

Once the write/read delay settings for the delay devices are determined, the ACE 325 may program the delay devices (e.g., delay devices 210 and 220) with the determined write/read delay settings.

In the example in FIG. 4, the matrix 410 includes an isolated pass entry 430 corresponding to the write delay setting of 15 and read delay setting of 2. The pass entry 430 is isolated in that the entry is not adjacent to any other pass entry. In this example, the ACE 325 does not include the isolated pass entry 430 in the pass region 420 for purposes of calculating the center of gravity discussed above. In general, the ACE 325 may determine the pass region as a group (region) of contiguous pass entries, and exclude isolated pass entries from the pass region.

The auto-calibration procedure discussed above may be performed at boot up and/or triggered by a trigger signal input to the ACE 325. The trigger signal may be an internal trigger signal 335 generated internally in the SoC or an external trigger signal 330 from an external device (not shown). Examples of triggers signals are discussed further below.

An advantage of the present disclosure is that the delay settings are auto-calibrated for each individual SoC. This is because the ACE 325 of each SoC determines delay settings that are specific to that SoC.

In addition, the ACE 325 allows the memory interface 318 to be used with different boards and/or different memory devices. This is because, when the memory interface 318 is used with a particular board and memory device, the ACE 325 auto-calibrates the delay settings to determine delay settings that work for the particular board and memory device.

Over a long period, the performance of a semiconductor device can degrade due to wear out. To account for the wear out, the ACE 325 may perform auto-calibration at each boot up so that the delay settings adapt to changes in the performance of the SoC over time. This can significantly improve PHY performance.

Figure 5:
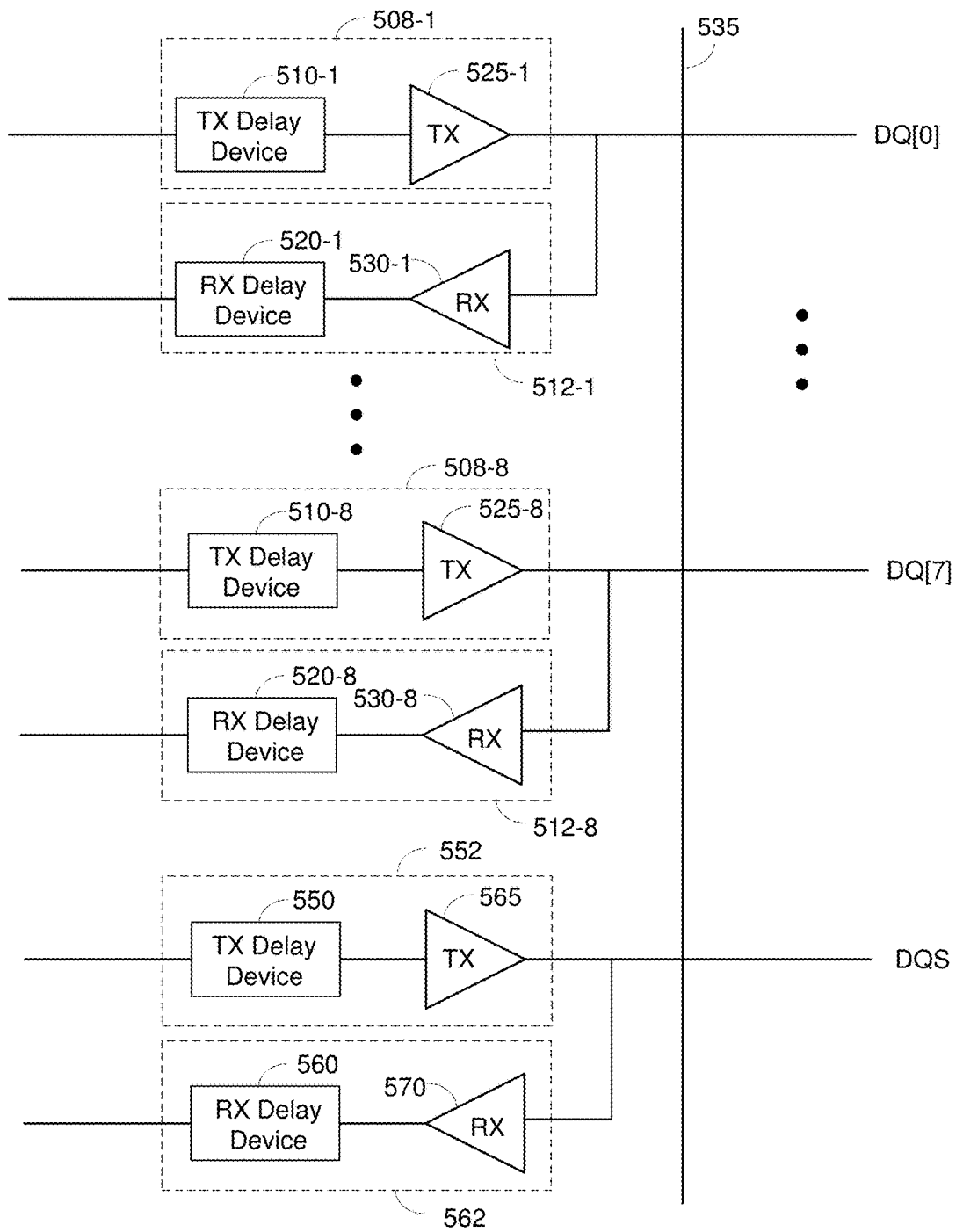
FIG. 5 shows an example of multiple delay devices for multiple data lines according to certain aspects of the present disclosure.

In certain aspects, the ACE 325 may be configured to determine delay settings for individual data lines and/or a data lane. In this regard, FIG. 5 shows an example in which the PHY block 130 includes multiple transmit paths 508-1 to 508-8 and multiple receive paths 512-1 to 512-8. Each transmit path 508-1 to 508-8 is paired with a respective one of the receive paths 512-1 to 512-8, and each pair of transmit and receive paths is coupled to a respective one of multiple bidirectional data bit lines DQ[0] to DQ[7]. For example, the pair of transmit and receive paths 508-1 and 512-1 is coupled data bit line DQ[0], as shown in FIG. 5. The bidirectional data bit lines DQ[0] to DQ[7] may include traces (e.g., on a PCB) for transferring data between the PHY block 130 and the external memory device 150. In FIG. 5, the boundary of the SoC is indicated by line 535.

Each transmit path 508-1 to 508-8 includes a respective one of multiple transmitters 525-1 to 525-8, and each receive path 512-1 to 512-8 includes a respective one of multiple receivers 530-1 to 530-8. Each transmitter 525-1 to 525-8 is configured to transmit a data signal to the memory device 150 over the respective data bit line, and each receiver 530-1 to 530-8 is configured to receive a data signal from the memory device 150 over the respective data line.

In the example in FIG. 5, there are eight data bit lines DQ[0] to DQ[7], which allows eight data bits to be transferred between the PHY block 130 and the external memory device 150 in parallel. The data bit lines DQ[0] to DQ[7] may collectively be referred to as a data lane. In this example, the data lane includes eight data bit lines DQ[0] to DQ[7], and therefore has a width of one data byte.

Each transmit path 508-1 to 508-8 also includes a respective one of multiple transmit delay devices 510-1 to 510-8. As discussed further below, each of the transmit delay devices has a programmable delay and provides a write delay for the respective one of the data bit lines DQ[0] to DQ[7]. For example, transmit delay device 510-1 provides a write delay for data bit line DQ[0].

Each receive path 512-1 to 512-8 includes a respective one of multiple receive delay devices 520-1 to 520-8. As discussed further below, each of the receive delay devices has a programmable delay and provides a read delay for the respective one of the data bit lines DQ[0] to DQ[7]. For example, receive delay device 520-1 provides a read delay for data bit line DQ[0].

The PHY block 130 also includes a transmit path 552 and a receive path 562 coupled to a bidirectional data strobe line DQS. The transmit path 552 includes a transmitter 565 configured to transmit a data strobe signal to the external memory device 150 over the data strobe line DQS for write operations. The data strobe signal may be transmitted concurrently with the transmission of data to be written to the external memory device. The external memory device 150 uses the data strobe signal to sample data bits received from the PHY block 130 over the data bit lines DQ[0] to DQ[7].

The receive path 562 includes a receiver 570 configured to receive a data strobe signal from the external memory device 150 over the data strobe line DQS for read operations. The data strobe signal from the memory device may accompany data received from the memory device. The PHY block 130 uses the received data strobe signal to sample data bits received from the external memory device 150 over the data bit lines DQ[0] to DQ[7]. For example, the PHY block 130 may include a read latch (not shown) for each data bit line, in which each read latch samples (captures) data bits from the respective data bit line on rising and/or falling edges of the data strobe signal.

The transmit path 552 also includes a transmit delay device 550 coupled to transmitter 565. The transmit delay device 550 has a programmable delay and is configured to apply the programmable delay to the data strobe signal transmitted to the external memory device 150 over the data strobe line DQS. The receive path 562 also includes a receive delay device 560 coupled to receiver 570. The receive delay device 560 has a programmable delay and is configured to apply the programmable delay to the data strobe signal received from the external memory device 150 over the data strobe line DQS. For ease of illustration, the delay control lines to the delay devices are not explicitly shown in FIG. 5.

As discussed above, the ACE 325 may be configured to determine write/read delay settings for each of the data bit lines DQ[0] to DQ[7]. In this regard, an auto-calibration procedure for determining write/read delay settings for data bit line DQ[0] is described below according to certain aspects of the present disclosure. It is to be understood that that the auto-calibration procedure described below may be repeated for each one of the other data bit lines DQ[1] to DQ[7] to determine write/read delay settings for each one of the other data bit lines DQ[1] to DQ[7].

The auto-calibration procedure for data bit line DQ[0] may be performed by the ACE 325. During the auto-calibration procedure, the ACE 325 sweeps transmit delay device 510-1 through different write delay settings, and sweeps receive delay device 520-1 through different read delay settings. For example, the ACE 325 may sequentially set transmit delay device 510-1 to each one of the different write delay settings. For each write delay setting, the ACE 325 may sequentially set receive delay device 520-1 to each one of the different read delay settings. In another example, the ACE 325 may sequentially set receive delay device 520-1 to each one of the different read delay settings. For each read delay setting, the ACE 325 may sequentially set the transmit delay device 510-1 to each one of the different write delay settings. In both of the above examples, each possible combination of write/read delay settings may be tested.

For each combination of write/read delay settings, the ACE 325 performs a read/write test using a test pattern. For example, the ACE 325 may instruct the memory controller 120 to write the test pattern to the memory device 150, and read back the test pattern from the memory device 150. The ACE 325 may specify an address in the memory device 150 to which the test pattern is written. The test pattern is transmitted to the external memory device over data bit line DQ[0] and received back from the external memory device 150 over data bit line DQ[0]. After the test pattern is read back from the memory device 150, the ACE 325 may compare the received test pattern with the test pattern that was transmitted. If the received test pattern and transmitted test pattern match, then the ACE 325 may determine that there were no errors, in which case the test result is a pass. If the received test pattern and transmitted test pattern do not match, then the ACE 325 may count a number of errors in the received test pattern (e.g., number of bits or bytes in the received test pattern that differ from the transmitted test pattern).

The ACE 325 may write the test result for each combination of write/read delay settings in a matrix on the on-chip memory 340, an example of which is shown in FIG. 4 discussed above. For each combination of write/read delay settings, the matrix (e.g., 410) includes the corresponding test result. Each test result may include a number indicating the number of errors for the corresponding combination of write/read delay settings. A test result of zero indicates no error (i.e., the test pattern was read back from the memory device 150 with no error). In one example, the ACE 325 may consider a test result including one or more errors a fail, and consider a test result with zero error a pass.

The ACE 325 may determine a pass region (e.g., pass region 420) in the matrix. The pass region may include a group of contiguous test results with no errors (contiguous passes). In certain aspects, the ACE 325 determines the combinations of write/read delay settings that belong to the pass region (e.g. pass region 420). The ACE 325 may exclude an isolated test result with no errors (isolated pass) from the pass region. As discussed above, an isolated test result with no errors (e.g., test result 430) is one that is not adjacent to another test result with no errors.

After determining the pass region, the ACE 325 may determine write/read delay settings for delay devices 510-1 and 520-1 by calculating a center of gravity of the pass region 420. The ACE 325 may calculate the center of gravity of the pass region by calculating the mean of the write delay settings in the pass region, and the mean of the read delay settings in the pass region.

After determining the center of the pass region, the ACE 325 may determine the combination of write/read delay settings located at the center of the pass region. If none of the combinations of write/read delay settings is located exactly at the center of the pass region, then the ACE 325 may determine the combination of write/read delay settings that is closest to the center of the pass region.

After the combination of write/read delay settings located at or closest to the center of the pass region is determined, the ACE 325 may store the corresponding write delay setting and corresponding read delay setting in the on-chip memory 340. During normal operation, the memory controller 120 may retrieve the write delay setting and read delay setting from the on-chip memory 340, set the delay of transmit delay device 510-1 according to the retrieved write delay setting, and set the delay of receive delay device 520-1 according to the retrieved read delay setting.

The ACE 325 may repeat the auto-calibration procedure discussed above for each one of the other data bit lines DQ[1] to DQ[7] to determine write/read delay settings for each one of the other data bit lines DQ[1] to DQ[7]. The ACE 325 may store the write/read delay settings for each of the data bit lines in the on-chip memory 340. During normal operation, the memory controller 120 may retrieve the write/read delay settings for each one of the data bit lines from the on-chip memory 340, and set the transmit/receive delay devices for each one of the data bit lines according to the corresponding write/read delay settings.

Thus, the ACE 325 may repeat the above auto-calibration procedure to set the write/read delays for individual data bit lines. This may be done, for example, to compensate for skew between the data bit lines.

In certain aspects, the ACE 325 may determine write/read delay settings for the data strobe signal. In this regard, an auto-calibration procedure for determining write/read delay settings for data strobe line DQS is described below according to certain aspects of the present disclosure.

During the auto-calibration procedure for the data strobe, the ACE 325 sweeps transmit delay device 550 through different write delay settings, and sweeps receive delay device 560 through different read delay settings.

For each combination of write/read delay settings, the ACE 325 performs a read/write test using a test pattern. For example, the ACE 325 may instruct the memory controller 120 to write the test pattern to the memory device 150, and read back the test pattern from the memory device 150. The ACE 325 may specify an address in the memory device 150 to which the test pattern is written. The test pattern may be transmitted to the external memory device over the data lane (i.e., data lines DQ[0] to DQ[7]) and received back from the external memory device 150 over data lane. After the test pattern is read back from the memory device 150, the ACE 325 may compare the received test pattern with the test pattern that was transmitted. If the received test pattern and transmitted test pattern match, then the ACE 325 may determine that there were no errors, in which case the test result is a pass. If the received test pattern and transmitted test pattern do not match, then the ACE 325 may count a number of errors in the received test pattern.

The ACE 325 may write the test result for each combination of write/read delay settings in a matrix on the on-chip memory 340. For each combination of write/read delay settings, the matrix includes the corresponding test result. Each test result may include a number indicating the number of errors for the corresponding combination of write/read delay settings. In one example, the ACE 325 may consider a test result including one or more errors a fail, and consider a test result with zero error a pass.

The ACE 325 may determine a pass region in the matrix. The pass region may include a group of contiguous test results with no errors (contiguous passes). In certain aspects, the ACE 325 determines the combinations of write/read delay settings that belong to the pass region (e.g. pass region 420). The ACE 325 may exclude an isolated test result with no errors (isolated pass) from the pass region, as discussed above.

After determining the pass region, the ACE 325 may determine write/read delay settings for delay devices 550 and 560 by calculating a center of gravity of the pass region 420. The ACE 325 may calculate the center of gravity of the pass region by calculating the mean of the write delay settings in the pass region, and the mean of the read delay settings in the pass region.

After determining the center of the pass region, the ACE 325 may determine the combination of write/read delay settings located at the center of the pass region. If none of the combinations of write/read delay settings is located exactly at the center of the pass region, then the ACE 325 may determine the combination of write/read delay settings that is closest to the center of the pass region.

After the combination of write/read delay settings located at or closest to the center of the pass region is determined, the ACE 325 may store the corresponding write delay setting and corresponding read delay setting in the on-chip memory 340. During normal operation, the memory controller 120 may retrieve the write delay setting and read delay setting from the on-chip memory 340, set the delay of transmit delay device 550 according to the retrieved write delay setting, and set the delay of receive delay device 560 according to the retrieved read delay setting.

Thus, the above auto-calibration procedure calibrates the write/read delay settings for the data strobe. This may be done, for example, to better align the data strobe signal with the data signals of the data lane. For example, for a read operation, it may be desirable for the edges (transitions) of the data strobe signal received from the memory device to be aligned with the center of the data eye (valid data window) of each of the data signals of the data lane so that the data signals are properly sampled at the PHY block 130.

The ACE 325 may perform both the auto-calibration procedure for the individual data lines and the auto-calibration procedure for the data strobe, or perform one of the auto-calibration procedures. For example, the ACE 325 may perform the auto-calibration procedure for the data strobe first to determine the delay settings for delay devices 550 and 560. The ACE 325 may then perform the auto-calibration procedure for the individual data lines to determine the delay settings for delay devices 510-1 to 510-8 and 520-1 to 520-8.

Figure 6:
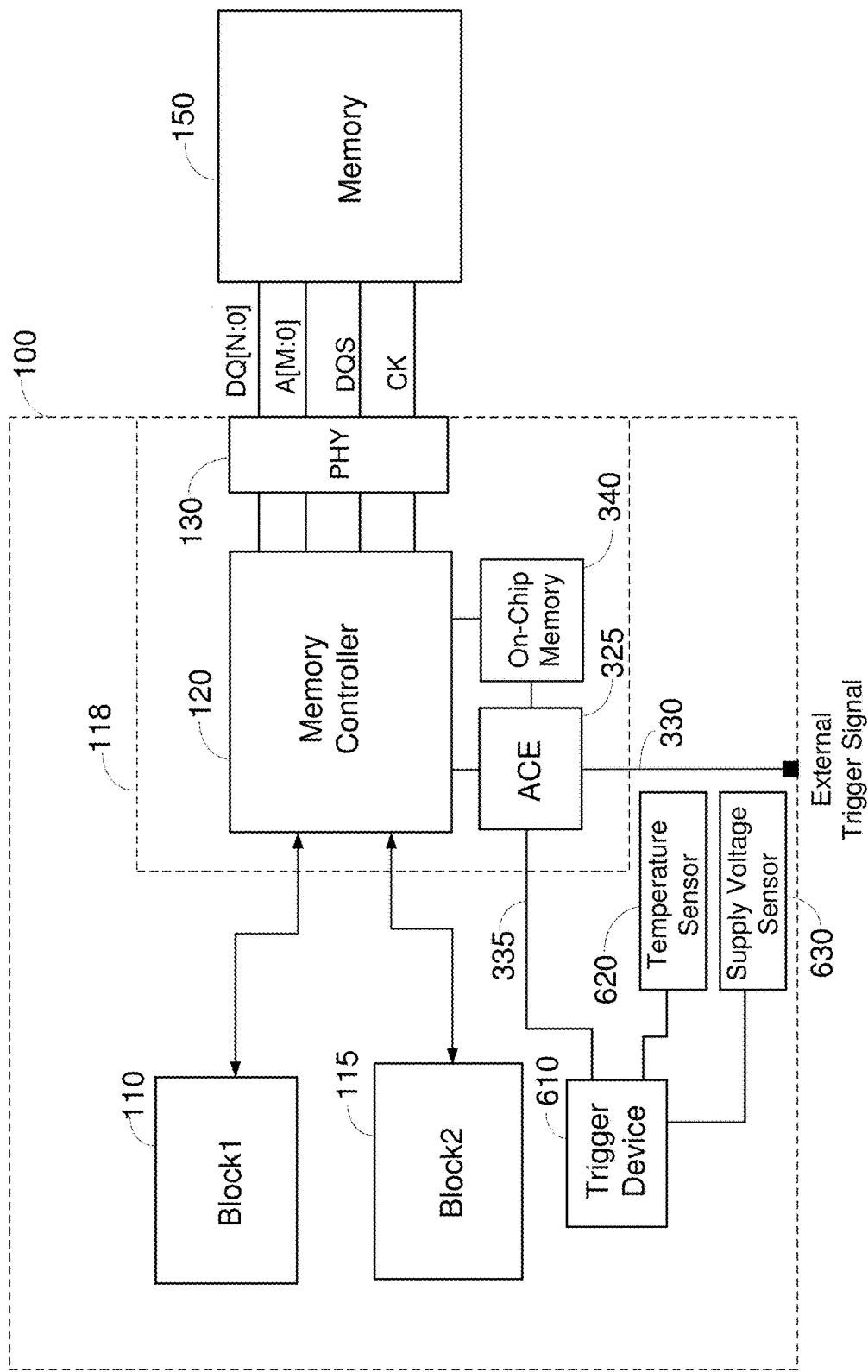
FIG. 6 shows an example of a trigger device configured to trigger the auto-calibration engine according to certain aspects of the present disclosure.

FIG. 6 shows an example in which the SoC 100 also includes a trigger device 610 configured to trigger the ACE 325 to perform auto-calibration under certain conditions, as discussed further below. The auto-calibration may include the auto-calibration procedure for individual data lines and/or the auto-calibration procedure for the data strobe.

In one example, the SoC includes an on-chip temperature sensor 620 configured to measure the temperature at a location on the SoC (e.g., location within or close to the memory interface 118), and generate temperature readings based on the measured temperature. In this example, the trigger device 610 may receive the temperature readings from the temperature sensor 620, and trigger the ACE 325 to perform auto-calibration when the temperature readings change by a certain amount. This may be done, for example, to adapt to changes in the skew of the data signals caused by changes in temperature.

In another example, the SoC includes an on-chip supply voltage sensor 630 configured measure the supply voltage on a supply rail (e.g., a supply rail located within or close to the memory interface 118), and generate supply voltage readings based on the measured supply voltage. The supply rail may provide power to the PHY block 130. In certain aspect, the supply voltage sensor 630 may include a ring oscillator powered by the supply voltage, in which the frequency of the ring oscillator is a function of the supply voltage. In these aspects, the supply voltage readings indicate the supply voltage by indicating the frequency of the oscillator, which is a function of the supply voltage. Generally, the lower the frequency, the lower the supply voltage. In this example, the trigger device 610 may receive the supply voltage readings from the supply voltage sensor 630, and trigger the ACE 325 to perform auto-calibration when the supply voltage readings change by a certain amount. This may be done, for example, to adapt to changes in the skew of the data signals caused by changes in the supply voltage powering the PHY block 130. The changes in the supply voltage may be caused by changes in the IR drop in the power distribution network providing the supply voltage, and/or another cause.

In yet another example, the trigger device 610 is configured to perform auto-calibration when the SoC is booted up (e.g., from a power-off state). In this example, the auto-calibration may be performed during initialization of the memory interface when the SoC is booted up.

Figure 7:
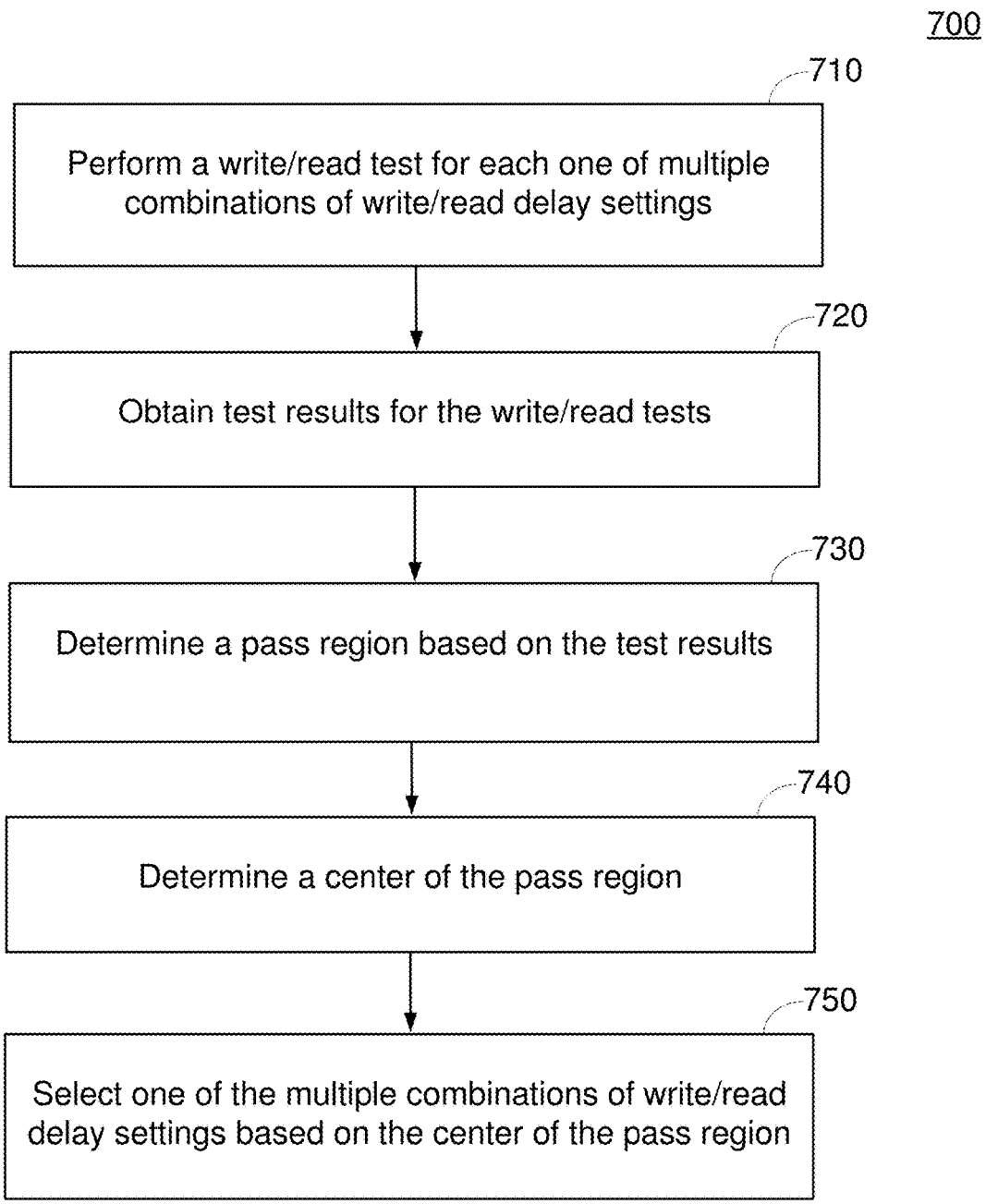
FIG. 7 is a flowchart illustrating a method for calibration of delay settings according to certain aspects of the present disclosure.

FIG. 7 is a flowchart showing a method 700 for performing calibration for delay settings of a memory interface according to certain aspects of the present disclosure. The method 700 may be performed by the auto-calibration engine 325 and the memory interface 120.

At step 710, a write/read test is performed for each one of multiple combinations of write/read delay settings. Each one of the multiple combinations of write/read delay settings includes one of a plurality of write delay settings of a first delay device (e.g., first delay device 210) and one of a plurality of read delay settings of a second delay device (e.g., second delay device 220). The write/read test for each combination of write/read delay settings may include writing a test pattern to a memory device (e.g., memory device 150) with the first delay device set to the respective write delay settings, and reading back the test pattern from the memory device with the second delay device set to the respective read delay setting.

At step 720, test results are obtained for the write/read tests. For example, the test result for each write/read test may indicate whether the write/read test is a pass or a fail.

At step 730, a pass region is determined based on the test results. For example, the pass region (e.g., pass region 420) may be determined based on a contiguous subset of the test results that are passes.

At step 740, a center of the pass region is determined. For example, the center of the pass region may be determined by determining a mean of the write delay settings in the pass region, and a mean of the read delay settings in the pass region.

At step 750, one of the multiple combinations of write/read settings is selected based on the center of the pass region. For example, one of the combinations of write/read settings located at or closest to the center of pass region may be selected. The first and second delay devices may be programmed with the selected combination of write/read settings for normal write and read operations.

The memory controller and ACE discussed above may be implemented with a general-purpose processor, a digital signal processor (DSP), an application specific integrated circuit (ASIC), a field programmable gate array (FPGA) or other programmable logic device, discrete hardware components (e.g., logic gates), or any combination thereof designed to perform the functions described herein. A processor may perform the functions described herein by executing software comprising code for performing the functions. The software may be stored on a computer-readable storage medium, such as a RAM, a ROM, an EEPROM, an optical disk, and/or a magnetic disk.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. A calibration method for a memory interface, comprising:
   performing a write/read test for each one of multiple combinations of write/read delay settings, wherein each one of the multiple combinations of write/read delay settings includes one of a plurality of write delay settings of a first delay device in a transmit path of the memory interface and one of a plurality of read delay settings of a second delay device in a receive path of the memory interface;
   obtaining test results for the write/read tests;
   determining a pass region based on the test results;
   determining a center of the pass region; and
   selecting one of the multiple combinations of write/read settings based on the center of the pass region.

2. The method of claim 1, wherein determining the pass region comprises determining a contiguous subset of the test results that are passes.

3. The method of claim 1, wherein determining the pass region comprises excluding one or more of the test results that are passes from the pass region, wherein the one or more of the test results that are passes are isolated from the contiguous subset of the test results that are passes.

4. The method of claim 1, wherein determining the center of the pass region comprises:
   determining a mean of the write delay settings in the pass region; and
   determining a mean of the read delay settings in the pass region.

5. The method of claim 1, wherein performing the write/read test for each one of the multiple combinations of write/read delay settings comprises:
   writing a test pattern to a memory device with the first device set to the respective write delay setting; and
   reading back the test pattern from the memory device with the second delay device set to the respective read delay setting.

6. The method of claim 5, wherein, for each one of the multiple combinations of write/read delay settings, the test pattern is written to the memory device over a bidirectional line and the test pattern is read back from the memory device over the bidirectional line.

7. The method of claim 6, wherein the bidirectional line is coupled between a chip and the memory device, and the memory device is external to the chip.

8. The method of claim 1, wherein selecting one of the multiple combinations of write/read settings comprises selecting one of the multiple combinations of write/read settings located at the center of the pass region.

9. The method of claim 1, wherein selecting one of the multiple combinations of write/read settings comprises selecting one of the multiple combinations of write/read settings located closest to the center of the pass region.

10. The method of claim 1, wherein the write/read tests are performed at boot up of a chip.

11. A memory interface, comprising:
a first delay device in a transmit path of the memory interface;
a second delay device in a receive path of the memory interface;
an auto-calibration engine configured to set delays of the first and second delay devices to each one of multiple combinations of write/read delay settings, each one of the multiple combinations of write/read delay settings including one of a plurality of write delay settings of the first delay device and one of a plurality of read delay settings of the second delay device; and
a memory controller configured to perform a write/read test for each one of the multiple combinations of write/read delay settings;
wherein the auto-calibration engine is further configured to:
obtain test results for the write/read tests;
determine a pass region based on the write/read test results;
determine a center of the pass region; and
select one of the multiple combinations of write/read settings based on the center of the pass region.

12. The memory interface of claim 11, wherein the auto-calibration engine is configured to determine the pass region by determining a contiguous subset of the test results that are passes.

13. The memory interface of claim 12, wherein the auto-calibration engine is configured to exclude one or more of the test results that are passes from the pass region, wherein the one or more of the test results that are passes are isolated from the contiguous subset of the test results that are passes.

14. The memory interface of claim 11, wherein the auto-calibration engine is configured to determine the center of the pass region by:
determining a mean of the write delay settings in the pass region; and
determining a mean of the read delay settings in the pass region.

15. The memory interface of claim 11, wherein, for each one of the multiple combinations of write/read delay settings, the memory controller is configured to perform the write/read test by:
writing a test pattern to a memory device with the first delay device set to the respective write delay setting; and
reading back the test pattern from the memory device with the second delay device set to the respective read delay setting.

16. The memory interface of claim 15, wherein the transmit and receive paths are coupled to a bidirectional line, and the bidirectional line is between the memory interface and the memory device.

17. The memory interface of claim 11, wherein the auto-calibration engine is configured to select one of the multiple combinations of write/read settings located at the center of the pass region.

18. The memory interface of claim 11, wherein the auto-calibration engine is configured to select one of the multiple combinations of write/read settings located closest to the center of the pass region.

19. A computer-readable medium comprising instructions stored thereon that, when executed by a processor, cause the processor to perform a calibration method for a memory interface, the calibration method comprising:
performing a write/read test for each one of multiple combinations of write/read delay settings, wherein each one of the multiple combinations of write/read delay settings includes one of a plurality of write delay settings of a first delay device in a transmit path of the memory interface and one of a plurality of read delay settings of a second delay device in a receive path of the memory interface;
obtaining test results for the write/read tests;
determining a pass region based on the test results;
determining a center of the pass region; and
selecting one of the multiple combinations of write/read settings based on the center of the pass region.

20. The computer-readable medium of claim 19, wherein determining the center of the pass region comprises:
determining a mean of the write delay settings in the pass region; and
determining a mean of the read delay settings in the pass region.

21. The computer-readable medium of claim 19, wherein performing the write/read test for each one of the multiple combinations of write/read delay settings comprises:
writing a test pattern to a memory device with the first device set to the respective write delay setting; and
reading back the test pattern from the memory device with the second delay device set to the respective read delay setting.

* * * * *